US007282706B2

(12) United States Patent
Russell et al.

(10) Patent No.: US 7,282,706 B2
(45) Date of Patent: Oct. 16, 2007

(54) ADVANCED OPTICS FOR RAPIDLY PATTERNED LASER PROFILES IN ANALYTICAL SPECTROMETRY

(75) Inventors: David H. Russell, College Station, TX (US); John A. McLean, Bryan, TX (US)

(73) Assignee: The Texas A&M University System, College Station, TX (US)

( * ) Notice: Subject to any disclaimer, the term of this patent is extended or adjusted under 35 U.S.C. 154(b) by 290 days.

(21) Appl. No.: 11/056,852

(22) Filed: Feb. 11, 2005

(65) Prior Publication Data

US 2005/0242277 A1 Nov. 3, 2005

Related U.S. Application Data

(60) Provisional application No. 60/544,098, filed on Feb. 12, 2004.

(51) Int. Cl.
*G21K 5/10* (2006.01)
*H01J 37/08* (2006.01)
*G21G 5/00* (2006.01)

(52) U.S. Cl. .................... 250/288; 250/492.1; 250/425; 250/503.1; 250/505.1; 250/493.1; 250/492.22; 372/26; 372/29.01; 372/29.014; 372/92; 372/99; 372/101; 372/103; 359/237; 359/240; 359/290; 359/291; 359/292

(58) Field of Classification Search ................. 250/288
See application file for complete search history.

(56) References Cited

U.S. PATENT DOCUMENTS

| | | | | |
|---|---|---|---|---|
| 4,566,935 | A * | 1/1986 | Hornbeck | 438/29 |
| 5,090,795 | A * | 2/1992 | O'Meara et al. | 359/240 |
| 5,251,222 | A * | 10/1993 | Hester et al. | 372/26 |
| 5,254,626 | A * | 10/1993 | Penco et al. | 525/166 |
| 6,020,988 | A * | 2/2000 | Deliwala et al. | 359/276 |
| 6,734,421 | B2 * | 5/2004 | Holle et al. | 250/287 |
| 6,804,410 | B2 * | 10/2004 | Lennon et al. | 382/274 |
| 6,818,889 | B1 * | 11/2004 | Sheehan et al. | 250/288 |
| 6,828,574 | B1 * | 12/2004 | Allen | 250/492.24 |
| 6,894,292 | B2 * | 5/2005 | Gil et al. | 250/492.2 |
| 6,995,840 | B2 * | 2/2006 | Hagler | 356/310 |
| 7,170,052 | B2 | 1/2007 | Furutani et al. | |
| 2001/0019401 | A1 * | 9/2001 | Irie et al. | 355/53 |
| 2002/0154272 | A1 * | 10/2002 | Shevlin | 351/237 |
| 2002/0155483 | A1 * | 10/2002 | Holle et al. | 435/6 |
| 2003/0063366 | A1 * | 4/2003 | Hunt | 359/279 |
| 2003/0086062 | A1 * | 5/2003 | Shevlin | 351/210 |

(Continued)

OTHER PUBLICATIONS

Arcturus "PixCell lle Laser Capture Microdissection (LCM) System", Dec. 13, 2003, <http://www.arctur.com.research_portal/products/pixell_main.htm>.

(Continued)

*Primary Examiner*—Robert Kim
*Assistant Examiner*—Bernard Souw
(74) *Attorney, Agent, or Firm*—Fulbright & Jaworski LLP

(57) ABSTRACT

The present invention is directed to a novel arrangement of optical devices for the rapid patterning of laser profiles used for desorption and/or ionization sources in analytical mass spectrometry. Specifically, the new optical arrangement provides for a user-defined laser pattern at the sample target that can be quickly changed (on a microsecond timescale) to different dimensions (or shapes) for subsequent laser firings.

46 Claims, 4 Drawing Sheets

U.S. PATENT DOCUMENTS

2003/0149531 A1* 8/2003 Hubert et al. .................. 702/1
2004/0005633 A1 1/2004 Vandekerckhove et al.
2004/0021078 A1* 2/2004 Hagler .................. 250/339.13
2005/0053850 A1* 3/2005 Askebjer et al. ............... 430/5
2005/0181314 A1* 8/2005 Gil et al. .................... 430/396
2005/0236564 A1* 10/2005 Keller et al. ................ 250/288
2005/0242277 A1* 11/2005 Russell et al. .............. 250/282
2006/0071160 A1* 4/2006 Haase et al. ................ 250/288
2006/0186332 A1* 8/2006 Haase et al. ................ 250/288

OTHER PUBLICATIONS

Wei et al., "Codes for Spectral-Amplitude-Coding Optical CDMA Systems", Journal of Lightwave Technology; Aug. 2002; 1284-1291; vol. 20 (8).

* cited by examiner

ADVANCED OPTICS FOR RAPIDLY PATTERNED LASER PROFILES IN ANALYTICAL SPECTROMETRY

This application claims priority to U.S. Provisional Application Ser. No. 60/544,098, filed on Feb. 12, 2004.

STATEMENT REGARDING FEDERALLY SPONSORED RESEARCH OR DEVELOPMENT

This work has been funded in whole or in part by U.S. government funding. The government may have certain rights in the invention.

TECHNICAL FIELD

The present invention relates generally to mass spectrometry, and more specifically to optically patterning laser profiles for laser desorption and/or ionization of species for mass spectroscopic analysis.

BACKGROUND OF THE INVENTION

It was recognized in the early 1960s that by generating ions in a spatially resolved region of a surface, one could obtain atomic or molecular weight maps, or images (of ion mass-to-charge (m/z)), based on the spatial distribution of analyte and mass spectrometry detection. (R. Castaing and G. Slodzian, Microanalysis by Secondary Ionic Emission, *J. Microsc.* 1, 395-410 (1962)). For many years, imaging mass spectrometry was largely limited to secondary ion mass spectrometry (SIMS) whereby secondary analyte ions are produced by impinging the surface with a focused beam (<1 μm) of high-energy particles (e.g., keV Cs+or Ga+) (see M. L. Pacholski and N. Winograd, Imaging with Mass Spectrometry, *Chem. Rev.* 99, 2977-3005 (1999)), or by using laser microprobe mass spectrometry (LMMS) in which UV photons are used to provide direct ablation and photoionization of the analyte in a spatially-resolved mode. (L. Van Vaeck, H. Struyf, W. Van Roy, and F. Adams, Organic and Inorganic Analysis with Laser Microprobe Mass Spectrometry. Part I: Instrumentation and Methodology, *Mass Spectrom. Rev.* 13, 189-208 (1994); L. Van Vaeck, H. Struyf, W. Van Roy, and F. Adams, Organic and Inorganic Analysis with Laser Microprobe Mass Spectrometry. Part II: Applications, *Mass Spectrom. Rev.* 13, 209-232 (1994)). However, both techniques are primarily limited to the analysis of atomic ions and small molecules (typically<500 amu) and ultimately provide spatial imaging resolution that directly depends on the focusing properties of the optics (i.e., ion or photon optical elements) used to define the ionizing beam. The general principle of LMMS is illustrated in FIG. 1 (prior art), which shows a molecular weight map for an organic dye patterned onto a nitrocellulose membrane. FIG. 1 depicts an imaging mass map by LDI-TOFMS of crystal violet (hexamethyl-pararosanaline, m/z=372) deposited onto nitrocellulose. in the shape of an ampersand "&." FIG. 1A is the optical microscopy image of the deposited material. FIG. 1B is the corresponding image obtained by LDI-TOFMS where white and black circles represent mass spectra with a signal-to-noise of less than and greater than 10 at m/z 372, respectively. Each mass spectrum represents the average of 10 laser shots and the laser spot (ellipse, ca. 50×90 μm) was translated in 95 μm increments to produce the resulting 780-pixel image. The analyte was interrogated by laser desorption/ionization time-of-flight mass spectrometry (LDI-TOFMS) by rastering the sample (via micropositioners) with respect to the laser spot (nitrogen laser, 337 nm) in 95 μm increments.

In the late 1980s, the development of matrix assisted laser desorption/ionization (MALDI) provided a means to generate gas-phase ions of large intact biomolecules (ca. $10^2$ to $10^6$ amu) from solid samples. (M. Karas, D. Bachmann, U. Bahr, F. Hillenkamp, Matrix-Assisted Ultraviolet Laser Desorption of Non-Volatile Compounds, *Int. J Mass Spectrom. Ion. Proc.* 78, 53-68 (1987)). MALDI consists of incorporating analyte molecules into the crystal lattice of a UV or IR absorbing matrix, whereby matrix and analyte molecules are desorbed and ionized upon irradiation of the sample at the appropriate matrix-absorbing wavelength. Caprioli and coworkers have described imaging mass spectrometry of peptides and proteins in thin (ca. 10-20 μm) tissue sections based on MALDI-TOFMS techniques (Caprioli U.S. Pat. No. 5,808,300; incorporated by reference herein). In this method, a homogenous layer of matrix is applied to the tissue section and then a full mass spectrum is recorded at each spatial location by moving the sample relative to the MALDI laser. (R. M. Caprioli, T. B. Farmer, and J. Gile, Molecular Imaging of Biological Samples: Localization of Peptides and Proteins Using MALDI-TOFMS," *Anal. Chem.* 69, 4751-4760 (1997)). By using conventional optical arrangements (i.e., an apertured primary laser beam and field lens, the final shape of the laser beam at the sample target is defined by the slit function of the aperture and exhibits a spatial resolution limited by the diffraction properties of the optics used (in practice, typically 10-20 μm for typical ultraviolet operation). This can be described by Equation 1:

$$d=1.22\times\lambda/NA \quad (1)$$

where d is the diffraction limited focus diameter, λ is the wavelength, and NA is the numerical aperture of the lens. (See for example, D. Malacara and Z. Malacara, "Diffraction in Optical Systems," Chapter 9 in Handbook of Lens Design, Marcel Dekker Inc., New York (1994)).

Recent advances in MALDI optics include the application of near-field scanning optical microscopy (NSOM; See for example, E. Betzig, J. K. Trautman, T. D. Harris, J. S. Weiner, and R. L. Kostelak, Breaking the Diffraction Barrier: Optical Microscopy on a Nanometric Scale, Science 251, 1468-1470 (1991) and references therein). This techniques help to overcome diffraction-limited spatial resolution. The use of NSOM techniques for LMMS was recently demonstrated for the analysis of small organic ions, such as dihydroxybenzoic acid and acetylcholine D (see A. Kossakovski, S. D. O'Connor, M. Widmer, J. D. Baldeschwieler and J. L. Beauchamp, Spatially Resolved Chemical Analysis with an NSOM-based Laser Desorption Microprobe, *Ultramicrosc.* 71, 111-115 (1998)), for anthracene and bis(phenyl-N,N-diethyltriazene) ether (see R. Stöckle, P. Setz, V. Deckert, T. Lippert, A. Wokaun, and R. Zenobi, Nanoscale Atmospheric Pressure Laser Ablation-Mass Spectrometry, Anal. Chem. 73, 1399-1402 (2001)), and for peptides and oligosaccarhides by MALDI with a spatial resolution<500 nm (see B. Spengler and M. Hubert, Scanning Microprobe Matrix-Assisted Laser Desorption Ionization (SMALDI) Mass Spectrometry: Instrumentation for Sub-Micrometer Resolved LDI and MALDI Surface Analysis, J. Am. Soc. Mass Spectrom. 13, 735-748 (2002)). Note that NSOM techniques require the physical aperture of the transmitted light be placed at a distance substantially closer to the image plane (i.e., sample surface) than the wavelength of transmitted light. For example, at UV wavelengths commonly used in MALDI applications, the aperture must be placed less than ca. 350 mn from the target surface. Experimentally, this is exceedingly challenging in MALDI where the sample topography can easily exceed micrometer(s) deviation in elevation unless stringent and difficult sample preparation procedures are used. Further, NSOM techniques are currently limited to generating symmetrical (typically round) spot shapes at the image plane (i.e., sample target) and cannot be easily changed to user defined dimensions or shape.

In 1986, Hornbeck described an innovative optical element for the spatial patterning of light based on digital micro-mirror arrays (DMAs) (Hornbeck, U.S. Pat. No. 4,566,935; incorporated by reference herein). The DMA consists of highly reflective aluminum micro-mirror elements (e.g., 10-20 μm on each side) that are typically constructed in an array (e.g., 1024×768 mirrors) format. By addressing each individual mirror via a bias voltage, the relative angle of each mirror (ca. +10° to −10°, relative to normal of the array) can be positioned via a torsion hinge and rapidly switched (ca. 10-20 μs) representing an "on" or "off" state. DMA devices have found widespread application in video imaging, projection, and telecommunications, and have more recently been used in analytical spectroscopy (see D. Dudley, W. Duncan, and J. Slaughter, Emerging Digital Micromirror Device (DMD) Applications, White Paper, DLP Products New Applications, Texas Instruments, Inc. Plano, Tex. 75086). For example, Winefordener and colleagues have described using a linear DMA array (2×420 mirror array) to construct a flat-field visible wavelength spectrometer. (E. P. Wagner II, B. W. Smith, S. Madden, J. D. Winefordner, and M. Mignardi, Construction and Evaluation of a Visible Spectrometer Using Digital Micromirror Spatial Light Modulation, *Appl. Spectrosc.* 49, 1715-1719 (1995)). In this instrument, light dispersion and collimation is achieved by a Rowland-type curved grating spectrograph and wavelength selectivity is obtained by placing a DMA at the focus plane of the spectrograph and selectively reflecting portions the spectrum onto a photomultiplier tube detector. Later, Fateley and coworkers described the use of DMAs for constructing Hadamard transform masks for multiplexed Raman imaging (see R. A. DeVerse, R. M. Hammaker, and W. G. Fateley, Hadamard Transform Raman Imagery with a Digital Micro-Mirror Array, Vib. Spectrosc. 19, 177-186 (1999); W. G. Fateley, R. M. Hammaker, and R. A. DeVerse, Modulations Used to Transmit Information in Spectrometry and Imaging, J. Mol. Struct. 550-551, 117-122 (2000)), and multiplexed near infrared flat-field spectroscopy (see R. A. DeVerse, R. M. Hammaker, and W. G. Fateley, Realization of the Hadamard Multiplex Advantage Using a Programmable Optical Mask in a Dispersive Flat-Field Near-Infrared Spectrometer, Appl. Spectrosc. 54, 1751-1758 (2000)). By using a DMA to affect a dynamic Hadamard matrix mask, limitations of moving fixed optical matrix masks could be overcome (e.g., slow translation times, positioning errors, differences in axial position owing to stacked masks, and fixed mask element sizes). Importantly, the Hadamard transform provided enhanced signal-to-noise over conventional scanning techniques (ca. a factor of 12-14) in good agreement with that predicted from theory (see F. C. A. Dos Santos, H. F. Carvalho, R. M. Goes, and S. R. Taboga, Structure, Histochemistry, and Ultrastructure of the Epithelium and Stroma in the Gerbil (Meriones unguiculatus) Female Prostate, *Tissue & Cell* 35, 447-457 (2003)).

BRIEF SUMMARY OF THE INVENTION

The present invention is directed to a novel arrangement of optical devices for the rapid patterning of laser profiles used for desorption and/or ionization sources in analytical mass spectrometry. Specifically, the new optical arrangement provides for a user-defined laser pattern at the sample target that can be quickly (μs-timescale) changed to different dimensions (or shapes) for subsequent laser firings. For each firing, the pattern of light can be constructed so that non-congruent regions are irradiated simultaneously, for ionizing multiple regions of interest or for providing a multiple ion sources for multiple mass spectrometers. The large number of wavelets constituting the light pattern can be used to project a conjugate perspective distorted image to eliminate perspective foreshortening at the image plane. Further, the laser profile can be repositioned on the target sample rather than conventional means of mechanically moving the sample target to analyze different spatial regions of the sample. The rapid patterning of laser profiles, according to the present invention, will significantly impact many areas of mass spectrometry ranging from imaging mass spectrometry (e.g., by patterning the laser spot to irradiate a region of interest) to increased throughput when coupled with high repetition rate laser technology.

In one aspect of the present invention, there is a method for inspecting a sample comprising the steps of providing a wavefront of photons from a photon source; transforming the wavefront of photons into a uniform intensity profile; selectively varying the spatial distribution of photons within the uniform intensity profile to construct a photon pattern; focusing the photon pattern on at least a portion of a sample; and, desorbing, and optionally ionizing, at least a portion of the sample. In some embodiments, the method further comprises mass spectrometric analysis of the sample after the step of desorbing. In some embodiments, the method further comprises ion mobility spectrometric analysis of the sample after the step of desorbing. In some embodiments of the method, the step of providing comprises generating photons from a radiation source selected from the group consisting of a laser, a Nernst glower, a globar, an arc discharge, a plasma discharge, a hollow cathode lamp, a synchrotron, a flashlamp, a resistively heated source, and any combination thereof. In some embodiments of the method, the step of transforming comprises using one or more refractive homogenizer optical elements. In some embodiments of the method, the one or more refractive homogenizer optical elements is selected from the group consisting of a prism homogenizer, a crossed-cylindrical lens array, an off-axis cylindrical lens, and any combination thereof. In some embodiments of the method, the step of transforming comprises using one or more non-refractive homogenizer optical elements. In some embodiments of the method, the one or more non-refractive homogenizer optical elements is selected from the group consisting of a reflective non-refractive optical element, a diffractive non-refractive optical element, and any combination thereof. In some embodiments of the method, the step of transforming comprises using a waveguide. In some embodiments of the method, the waveguide is a fiber optic. In some embodiments of the method, the step of selectively varying comprises using a component selected from the group consisting of a digital micro-mirror array, a variable slit, an optical mask, and any combination thereof. In some embodiments of the method, the sample is biological tissue. In some embodiments of the method, the biological tissue is plant or animal tissue. In some embodiments of the method, the sample is a laser microcapture dissection sample. In some embodiments of the method, the sample is selected from the group consisting of a protein, a nucleotide, a nucleic acid, a deoxynucleic acid, a protein microarray, a nucleotide microarray, a nucleic acid microarray, a deoxynucleic acid microarray, an immobilized biological material, a patterned biological material, and any combination thereof. In some embodiments of the method, the sample is selected from the group consisting of inorganic samples, semiconductors, ceramics, polymers, composites, metals, alloys, glasses, fibers, and any combination thereof. In some embodiments of the method, the method further comprises the step of correcting said spatial distribution for perspective distortion. In some embodiments of the method having a correcting step, the step of correcting comprises using selected photon patterns for said step of focusing, said selected photon patterns designed to eliminate perspective distortion. In some embodiments of the method having a correcting step, the step of correcting comprises calibrating for perspective distortion using an image captured by a CCD array.

In another aspect of the present invention, there is an apparatus for inspecting a sample, the apparatus comprising a source for providing a wavefront of photons, the source having sufficient power to desorb, and optionally ionize, at least a portion of the sample; means for transforming the wavefront of photons into a uniform intensity profile, the means for transforming being fluidly coupled to the source; means for selectively varying the spatial distribution of photons within the uniform intensity profile to construct a photon pattern, the means for selectively varying being fluidly coupled to the means for transforming; and, means for focusing the photon pattern onto the sample, the means for focusing being fluidly coupled to the means for selectively varying. In some embodiments of the apparatus, the apparatus further comprises a mass spectrometer fluidly coupled to said sample such that at least a portion of material desorbed and optionally ionized from said sample enters said mass spectrometer In some embodiments of the apparatus, the apparatus further comprises an ion mobility spectrometer fluidly coupled to said sample such that at least a portion of material desorbed and optionally ionized from said sample enters said ion mobility spectrometer In some embodiments of the apparatus, the source is selected from the group consisting of a laser, a Nernst glower, a globar, an arc discharge, a plasma discharge, a hollow cathode lamp, a synchrotron, a flashlamp, a resistively heated source, and any combination thereof. In some embodiments of the apparatus, the means for transforming comprises one or more refractive homogenizer optical elements. In some embodiments of the apparatus, the one or more refractive homogenizer optical elements is selected from the group consisting of a prism homogenizer, a crossed-cylindrical lens array, an off-axis cylindrical lens, and any combination thereof. In some embodiments of the apparatus, the means for transforming comprises one or more non-refractive homogenizer optical elements. In some embodiments of the apparatus, the one or more non-refractive homogenizer optical elements is selected from the group consisting of a reflective homogenizer optical element, a diffractive homogenizer optical element, and any combination thereof. In some embodiments of the apparatus, the means for selectively varying is selected from the group consisting of a digital micro-mirror array, a variable slit, an optical mask, and any combination thereof. In some embodiments of the apparatus, the means for selectively varying is a digital micro-mirror array.

In another aspect of the present invention, there is a method for inspecting a sample comprising the steps of providing a plurality of wavefronts of photons from a plurality of photon sources; transforming the plurality of wavefronts into a plurality of uniform intensity profiles; selectively varying the spatial distribution of photons within the uniform intensity profiles to construct a plurality of photon patterns; focusing the plurality photon patterns onto a sample; and, desorbing, and optionally ionizing, at least a portion of the sample to form a plurality of packets of desorbed and optionally ionized material. In some embodiments of the method, the method further comprises the step of mass spectrometric analysis of the sample after the step of desorbing, the step of mass spectrometric analysis being performed with one or more mass spectrometers. In some embodiments of the method, the method further comprises the step of ion mobility analysis of the sample after the step of desorbing, the step of ion mobility spectrometric analysis being performed with one or more ion mobility spectrometers. In some embodiments of the method, the step of providing comprises generating photons from a radiation source selected from the group consisting of a laser, a Nernst glower, a globar, an arc discharge, a plasma discharge, a hollow cathode lamp, a synchrotron, a flashlamp, a resistively heated source, and any combination thereof. In some embodiments of the method, the step of transforming comprises using one or more refractive homogenizer optical elements. In some embodiments of the method, the one or more refractive homogenizer optical elements is selected from the group consisting of a prism homogenizer, a crossed-cylindrical lens array, an off-axis cylindrical lens, and any combination thereof. In some embodiments of the method, the step of transforming comprises using one or more non-refractive homogenizer optical elements. In some embodiments of the method, the one or more non-refractive homogenizer optical elements is selected from the group consisting of a reflective non-refractive optical element, a diffractive non-refractive optical element, and any combination thereof. In some embodiments of the method, the step of transforming comprises transforming using a waveguide. In some embodiments of the method, the waveguide is a fiber optic. In some embodiments of the method, the step of selectively varying comprises using a component selected from the group consisting of a digital micro-mirror array, a variable slit, an optical mask, and any combination thereof. In some embodiments of the method, the sample is biological tissue. In some embodiments of the method, the biological tissue is plant or animal tissue. In some embodiments of the method, the sample is a laser microcapture dissection sample. In some embodiments of the method, the sample is selected from the group consisting of a protein, a nucleotide, a nucleic acid, a deoxynucleic acid, a protein microarray, a nucleotide microarray, a nucleic acid microarray, a deoxynucleic acid microarray, an immobilized biological material, a patterned biological material, and any combination thereof. In some embodiments of the method, the sample is selected from the group consisting of inorganic samples, semiconductors, ceramics, polymers, composites, metals, alloys, glasses, fibers, and any combination thereof. In some embodiments of the method, the method further comprises the step of correcting said spatial distribution for perspective distortion. In some embodiments of the method having a correcting step, the step of correcting comprises using selected photon patterns for said step of focusing, said selected photon patterns designed to eliminate perspective distortion. In some embodiments of the method having a correcting step, the step of correcting comprises calibrating for perspective distortion using an image captured by a CCD array. In some embodiments of the method, the plurality of photon patterns are noncongruent photon patterns.

In another aspect of the present invention, there is a method for inspecting a sample comprising the steps of providing a wavefront of photons from a photon source; transforming the wavefront of photons into a uniform intensity profile; selectively varying the spatial distribution of photons within the uniform intensity profile to construct a photon pattern; focusing the photon pattern on at least a portion of a sample; desorbing, and optionally ionizing, at least a portion of the sample to form a desorbed sample; and, thereafter performing mass spectrometry, or ion mobility spectrometry, or a combination of ion mobility spectrometry and mass spectrometry on at least a portion of the desorbed and optionally ionized sample.

The present invention is directed to a system and method which a novel arrangement of optical devices for the rapid patterning of laser profiles used for desorption and/or ionization sources in analytical mass spectrometry. Specifically, the new optical arrangement provides for a user-defined laser pattern at the sample target that can be quickly (μs-timescale) changed to different dimensions (or shapes) for subsequent laser firings. Alternatively, the laser profile can be repositioned on the target sample rather than conventional means of moving the sample target to analyze different spatial regions of the sample. The rapid patterning of laser profiles, according to the present invention, will significantly impact many areas of mass spectrometry ranging from imaging mass spectrometry (e.g., by patterning the laser spot to irradiate a region of interest) to increased throughput when coupled with high repetition rate laser technology.

Optical arrangements of the present invention, are used for rapidly patterning a laser spot on to a target sample for the purpose of desorbing and/or generating ions to be analyzed by mass spectrometry techniques (see FIG. 2). Briefly, the primary laser beam is expanded and shaped by use of a beam expander and beam shaping lenses. The conditioned beam is then passed through a homogenizer array(s) to produce a beam wavefront of equal intensity across the cross section of the beam. This light is then reflected on the DMA. Based on the desired pattern applied to the individual mirrors of the DMA, the patterned light is focused onto the sample target by means of a field lens.

The present invention differs from the prior art in that an innovative optical arrangement comprising a DMA is used to spatially pattern light onto a sample target surface for the purposes of desorption and/or ionization of material for mass spectrometric analysis. By defining the dimensions and shape of the laser radiation at the surface, one can precisely control the sample interrogation region in imaging mass spectrometry techniques. For example, complex shapes, such as individual cells in a tissue section (e.g., exhibiting diseased vs. healthy morphology), can be easily selected for selective irradiation and subsequent mass analysis. Further, spatial resolution can be significantly enhanced (ca. 0.5 to 2 μm) over conventional MALDI imaging mass spectrometry (ca. 10 to 20 μm), by using the small spatial mirror elements of the DMA rather than slits to aperture the laser radiation. A second application of this optical arrangement is to rapidly (ca. 10 to 20 μs) raster laser irradiation across the sample, at a high repetition rate, for increased throughput and enhanced sensitivity in mass spectrometric applications. This is in contrast with conventional methods of physically repositioning the sample target with respect to the static optical arrangements typically used.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 2A shows the optical platform while FIG. 2B shows the light profiles at various points in the platform.

FIG. 3A: selective targeting of a single fibroblast cell. FIG. 3B: selective targeting of four normal stroma cells situated proximal to the fibroblast.

FIG. 4A illustrates of a typical arrangement of oblique ionization and camera imaging of the target. FIG. 4B illustrates the hypothetical shape of a square on the sample stage when viewed normal to the target and the projected or viewed images obtained at oblique angles. FIG. 4C illustrates trigonometric relationships used to correct for oblique perspective distortion in the projected ionizing radiation and the imaging optics.

DETAILED DESCRIPTION OF THE INVENTION

Figure 1:
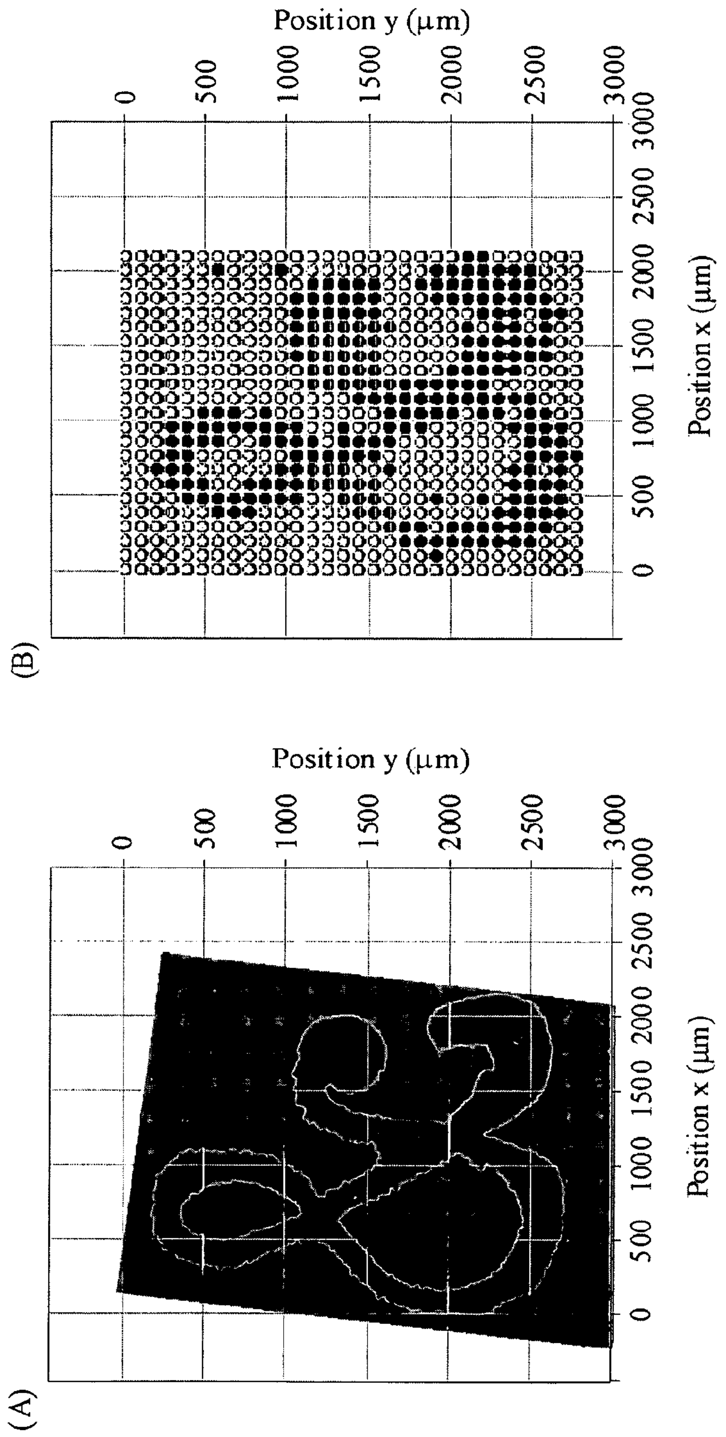
PRIOR ART FIG. 1
FIG. 1 depicts an imaging mass map by LDI-TOFMS of crystal violet (hexamethyl-pararosanaline, m/z=372) deposited onto nitrocellulose.

As used herein, “a” or “an” means one or more, unless otherwise indicated. The singular encompasses the plural and the plural encompasses the singular.

As used herein, the term “fluidly coupled”, with respect to two or more optical components refers to the flow of light or matter between the components, so that the light and/or matter output of one component is substantially the input of one or more other components.

As used herein, “inspecting” or “inspection”, in the context of performing work on a sample, is defined in its broadest terms, and includes, but is not limited to, inspection of the entire sample or the inspection of one or more selected portions or spatial regions of a sample. Although the term "inspection" may include both the sampling of material and the subsequent analysis of the sampled material, it also includes sampling of the material itself without any further chemical analysis. As an example, the laser desorption of part of a sample constitutes an inspection of that part of the sample, regardless of whether or not that desorbed portion is subsequently further analyzed (with, for example, a mass spectrometer, or some other analytical instrument or technique). In those cases where "inspection" of a material does not include chemical analysis of the material, "inspection" is synonymous with "sampling" of material.

The present invention is directed to one or more novel arrangements of optical devices for the rapid patterning of laser profiles used for desorption and/or ionization sources in analytical mass spectrometry. Specifically, the new optical arrangement provides for a user-defined laser pattern at the sample target that can be quickly (μs-timescale) changed to different dimensions (or shapes) for subsequent laser firings. Alternatively, the laser profile can be repositioned on the target sample dynamically by optics rather than conventional means of mechanically moving the sample target relative to static optics for analyzing different spatial regions of the sample.

The present invention is also directed to methods of spatially interrogating samples with spatially-resolved light for the purpose of desorbing and/or ionizing at least some of the sample for mass spectral analysis. In some embodiments, a laser is used as the source of light. In some embodiments, a digital micro-mirror array is used to impart a spatial component to such light. In some embodiments, beam conditioning optics and/or beam homogenizing optics are employed. In some embodiments, a matrix material or substance is employed to assist in the desorption and/or ionization process as in, for example, MALDI techniques.

The present invention is also directed to a system for spatially interrogating samples for mass spectrometric analysis. In some embodiments, such systems comprise the integration of traditional laser desorption mass spectrometers and techniques with one or more digital micro-mirror arrays (DMA), the latter providing spatial attributes to the incident laser beam. Such systems may comprise a host of additional optics for the conditioning and homogenizing of the incident laser beam. Additionally, the DMA is capable of being addressed in a user-defined and programmable manner. In some embodiments, the system may comprise a device for optically identifying the targeted region and, hence, the spatial properties of the incident beam. Suitable DMAs, for use according to the present invention, include the Discovery 1100 series DMA (e.g., the Discovery 1100 UV) available from Productivity Systems, Inc., Richardson, Tex.

The optical arrangement of the present invention is preferably comprised of six major components: a high intensity light source (e.g., laser), primary beam conditioning optics, beam homogenizer optics, a post-homogenization collimation lens, a digital micro-mirror array (DMA), and a lens to focus the patterned light image onto the target sample stage of a mass spectrometer. Briefly, the primary laser radiation is expanded to generate a collimated beam of light. Conditioning optics can provide for the shaping of the incident radiation to optimally illuminate the homogenizer and/or array (e.g., the DMA). The primary beam is then directed through optical elements for spatial light intensity homogenization (e.g., refractive homogenizer optical elements (prism homogenizers, crossed-cylindrical lens arrays, off-axis cylindrical lenses, etc.), or non-refractive homogenizer optical elements (reflective, diffractive, etc.)) to transform the wavefront from a non-uniform intensity profile to a uniform intensity profile which is directed to a DMA. The means for transforming the wavefront to one having uniform intensity profile are those beam homogenizer optics described above as well as others known to those of skill in the art.

Figure 2:
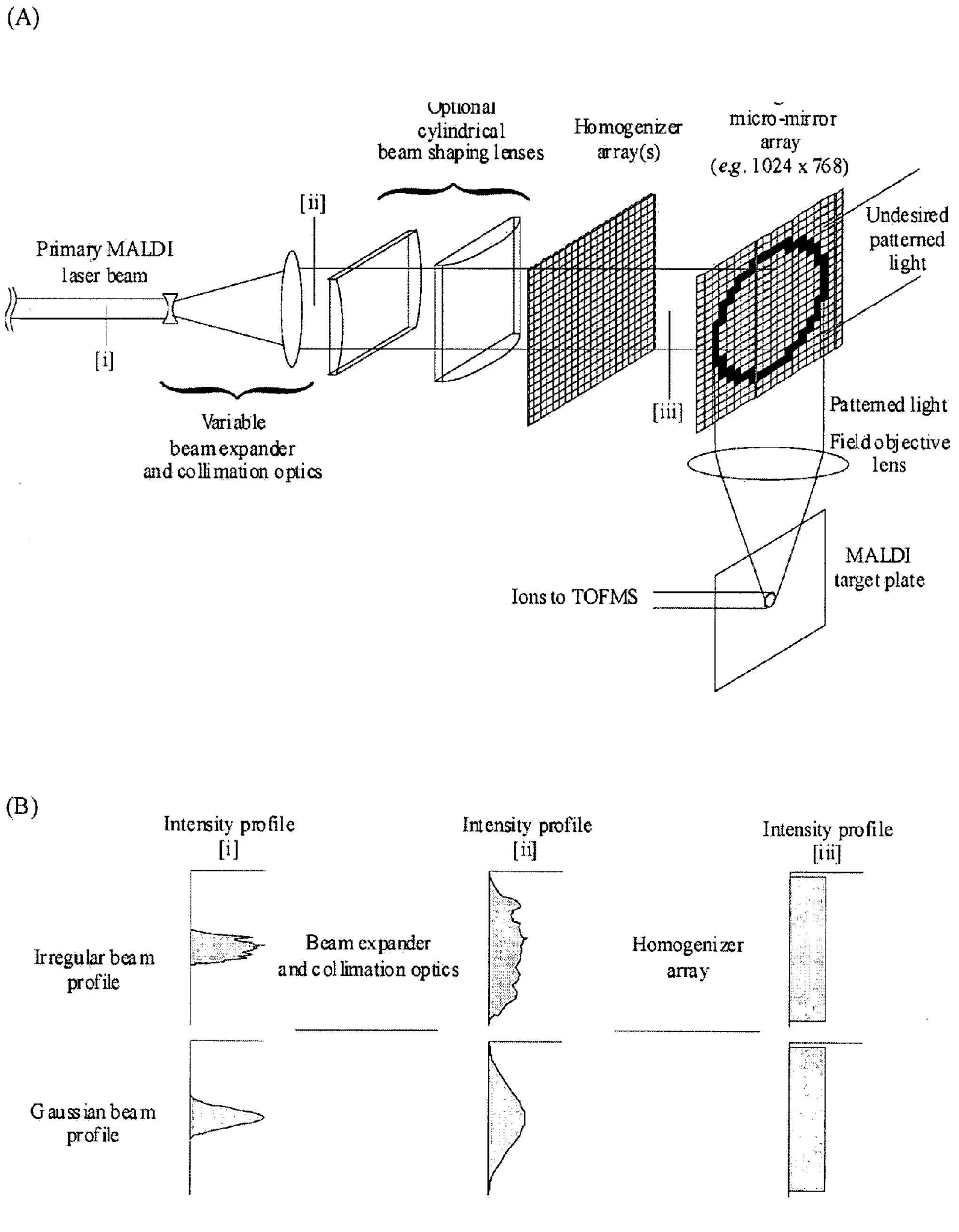
FIG. 2 is a schematic diagram illustrating an embodiment of the present invention.

FIG. 2 describes the optical platform and light profiles in one embodiment of the present invention. Referring to FIG. 2A, the primary beam of radiation is first expanded and shaped to the proximal dimensions of the DMA. The light is then passed through a beam homogenizer(s), reflected from the programmed pattern of the DMA and then focused onto the sample target for desorption and/or ionization. A field objective lens is shown in FIG. 2A as a means for focusing, however, any suitable means, known to those of skill in the art may be used. Other lenses and other focusing optics and/or elements, known to those of skill in the art, may be used as well. Another non-limiting example of such means for focusing is a parabolic mirror. Referring to FIG. 2B, a hypothetical illustration of the intensity profile of the light wavefront at different regions in this optical arrangement is shown. The points labeled (i), (ii), and (iii) in FIG. 2B correspond to those regions labeled in FIG. 2A. The result in (iii) is a wavefront having a uniform intensity profile (also referred to herein, as a "uniform intensity profile"). Thus, the patterned laser spot of the present invention provides for a spatially-resolved region of a sample to be interrogated. Although the means for selectively varying the spatial distribution of photons within a uniform intensity profile to construct a photon pattern is preferably a DMA, a variable slit, an optical mask, or any combination of these optical components. These means may also be any equivalent optical elements known to those of skill in the art.

Figure 3:
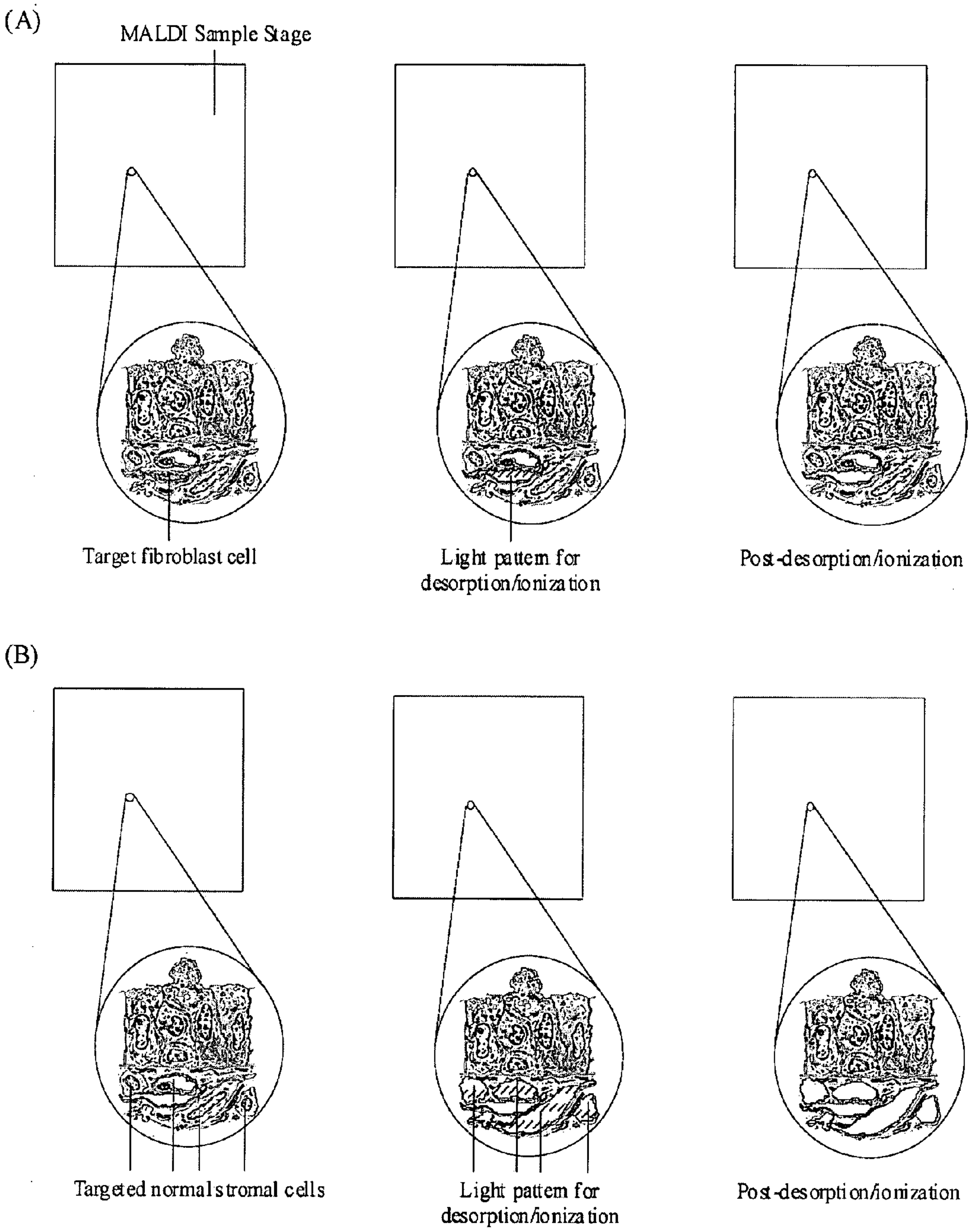
FIG. 3 illustrates light patterning for the selective desorption/ionization of targeted material for a representative embodiment wherein a thin tissue section of gerbil stroma and epethial cells.

The DMA is operated by loading a series of patterns into on-board memory and each is then performed in a defined temporal sequence. Based on the state of each mirror element in the array (typically 1024×768 individual mirrors) the light directed toward the mass spectrometer is the pattern of reflected light from the DMA. Subsequent collimation and field optics can be used to focus the laser pattern to a spot on the sample target. FIG. 3 illustrates light patterning for the selective desorption/ionization of targeted material for a representative embodiment wherein a thin tissue section of gerbil stroma and epethial cells is immobilized onto a sample target. FIG. 3A illustrates the selective targeting of a single fibroblast cell. FIG. 3B illustrates the selective targeting of four normal stroma cells situated proximal to the fibroblast. The latter case illustrates that the light pattern for desorption does not need to be congruent.

Using optical microscopy, the position and morphology of cells on the target is imaged. Based on the optical image a pattern is applied to the DMA to select a single, or several, cells for ionization (e.g., to independently analyze cells displaying diseased vs. healthy morphologies). Note that the pattern(s) need not be congruent, i.e., several regions of the sample target can be irradiated simultaneously in a single or for multiple shots (FIG. 3B). In this manner, the sample can be quickly screened for biomarkers of diseased vs. healthy state, similar to conventional imaging MALDI MS.

By patterning light to selectively probe histological regions of interest, the described optics can be used in a manner similar to that of Laser Capture Microdissection (LCM) (see P. M. Conn, Ed., Methods in Enzymology-Laser Capture Microscopy and Microdissection, Vol. 356, Academic Press, New York, (2002)). However, unlike conventional LCM techniques that use a raster-mode of laser operation, the present innovation can irradiate an entire region or outline of the target sample directly. By utilizing the preferred embodiment in an LCM-mode, LCM-MS experiments can be performed rapidly in that LCM sample preparation is not decoupled from the MS analysis as it is in conventional LCM.

By moving the laser radiation relative to the target sample plate, challenges associated with mechanically moving the sample plate are overcome. For example, by using mechanical micropositioners to move the sample plate relative to the laser spot, moving parts can quickly wear giving rise to hysteresis and the need for frequent recalibration for precise positioning. In contrast, the bi-state micromirrors of the DMA must only be calibrated once for spatial position on the target plate.

In contrast to conventional MALDI optics, a further advantage, in terms of spatial resolution, is obtained by beam homogenization and DMA patterning of light. Because of the size of the individual micromirrors (ca. 13 μm) the effective aperture size can be reduced significantly by using only a few mirrors coupled with focusing optics. Further, by homogenizing the laser beam, differences in fluence at the sample target and corresponding signal intensity will be minimized. The latter is particularly important for spatial accuracy in MALDI imaging mass spectrometry, for example, in the determination of differential protein expression in different tissue regions (e.g., diseased vs. healthy), rapidly identifying and mapping tumor-specific markers in biopsies, (see P. Chaurand and R. M. Caprioli, Direct Profiling and Imaging of Peptides and Proteins from Mammalian Cells and Tissue Sections by Mass Spectrometry," Electrophoresis 23, 3125-3135 (2002)), or for imaging the spatial distribution of pharmaceuticals in targeted tissue.

Figure 4:
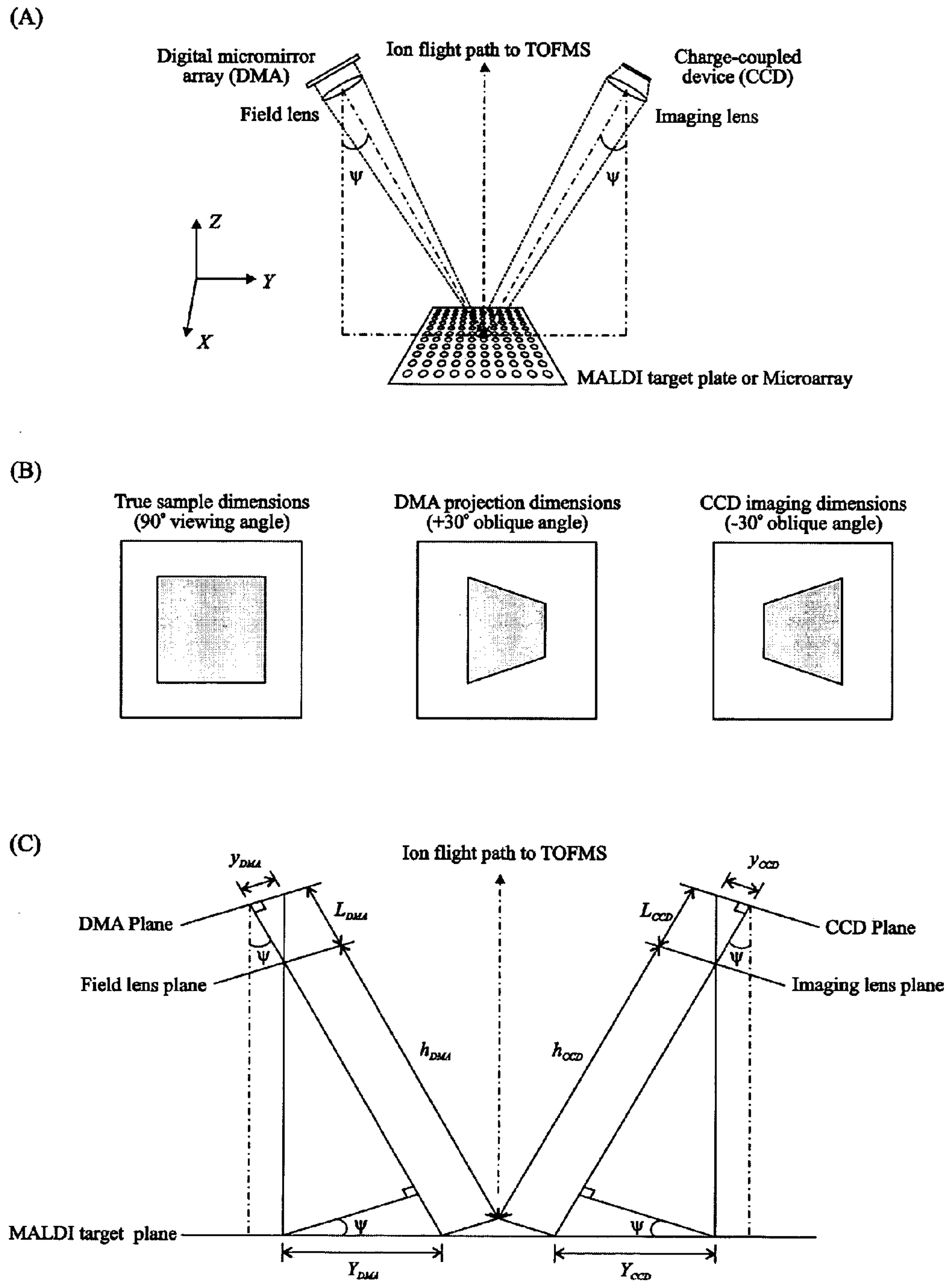
FIG. 4 illustrates the problem of perspective distortion.

A further challenge in contemporary imaging MS experiments arises from viewing and irradiating the sample stage from oblique angles relative to normal of the MALDI target. In most cases this occurs owing to practical considerations whereby it is most convenient to sample and focus the ions directly normal to the target stage, and difficulties associated with directing the laser and imaging optics collinear with the ion beam. This arrangement is depicted in FIG. 4A where the laser radiation and the target imaging optics (e.g. a charge coupled device of "CCD") are focused to the MALDI target at +30° and −30° relative to normal of the MALDI target. If, for example, a square target spot to be irradiated is viewed orthogonal to the MALDI stage it would appear as in FIG. 4B, left. However, owing to the oblique angle used for irradiation and viewing, a square projected onto the stage would appear as a trapezoid (FIG. 4B, center), and the "true" square sample spot to be irradiated would appear at the imaging optics to be an inverted trapezoid relative to the irradiation (FIG. 4B, right). Clearly, the extent of image foreshortening, or perspective distortion, for projection or viewing directly depends on the relative viewing polar coordinates and the oblique viewing angle (ψ).

The size of the perspective foreshortened object (projected or imaged) also varies inversely both with the distance of the object in the target imaging plane (DMA to MALDI target) and CCD imaging plane (MALDI target to CCD). The imaging foreshortening owing to the oblique projection and imaging angles can be described algebraically based on geometrical optics (see J. A. McLean, M. G. Minnich, A. Montaser, J. Su, and W. Lai, Optical Patternation: A Technique for Three-Dimensional Aerosol Diagnostics, Anal. Chem. 72, 4796-4804 (2000); and W. Lai, S. Alfini, and J. Su, Development of an Optical Pattemator for the Quantitative Characterization of Liquid Sprays. 10th International Symposium on Applications of Laser Techniques to Fluid Dynamics, Lisbon, Portugal, July 2000). Briefly, the trigonometric relation between the DMA and the MALDI target (or MALDI target and CCD array) can be described by:

$$x_{DMA} = \frac{X_{DMA}L_{DMA}}{h_{DMA}}\frac{1}{1-(Y_{DMA}\sin\psi_{DMA})/h_{DMA}} \text{ and } \qquad (2)$$

$$y_{DMA} = \frac{Y_{DMA}L_{DMA}\cos\psi_{DMA}}{h_{DMA}}\frac{1}{1-(Y_{DMA}\sin\psi_{DMA})/h_{DMA}}$$

where ($x_{DMA}$, $y_{DMA}$) are the coordinates of the image on the DMA, ($X_{DMA}$, $Y_{DMA}$) are the coordinates of the patterned irradiation in the MALDI target plane, $\psi_{DMA}$ is the oblique irradiation angle, $L_{DMA}$ is the distance between the DMA and focusing field lens, and $h_{DMA}$ is the distance from the center of the field lens to the center of the irradiated scene (FIG. 4C). Although the equations describing the perspective distortion from the MALDI target to the CCD image plane are identical (i.e. projection or imaging), a distinction is made owing to potential differences in the experimental arrangements for oblique angle ($\psi_{DMA}$ vs. $\psi_{CCD}$), lens-to-projection distance ($L_{DMA}$ vs. $L_{CCD}$), and image-to-lens distance ($h_{DMA}$ vs. $h_{CCD}$). In both cases, the magnitude of (Y sin ψ/h) for practical experimental arrangements is <<1 and thus a MacLaurin binomial series expansion of Eqns. 2 can be performed:

$$x = \frac{XL}{h}\left(1+\frac{\sin\psi}{h}Y+\frac{\sin^2\psi}{h^2}Y^2+\frac{\sin^3\psi}{h^3}Y^3+\dots\right) \text{ and } \qquad (3)$$

$$y = \frac{YL\cos\psi}{h}\left(1+\frac{\sin\psi}{h}Y+\frac{\sin^2\psi}{h^2}Y^2+\frac{\sin^3\psi}{h^3}Y^3+\dots\right)$$

In the limit of projection or imaging approaching a geometry orthogonal to the target (ψ→0), the first-order approximation of Eqn. 3 is exact. By using oblique projection and imaging angles, the first-order approximation introduces an error of relatively small magnitude (0-5% in spatial dimensions across a target 30 cm from the projected object or imaging camera at angles of 15° to 60°, respectively). By preferably first calibrating, and subsequently correcting for perspective distortion in the image captured by, preferably, the CCD array (other image capture methods are applicable), a simultaneous calibration and correction can be applied to the DMA array whereby the foreshortened patterned irradiation is corrected by projecting a conjugate distorted image from the DMA so that a "true" sample is irradiated on the MALDI target plate. Such calibration and correction methods are known to those of skill in the art and are those commonly used in the field of particle imaging velocimetry, and in the filed of optical patternation, among others. Importantly, the calibration for correcting imaging foreshortening needs to be performed only once for a particular optical arrangement. All subsequent image corrections can be performed dynamically, because the micromirrors of the DMA do not exhibit hysteresis due to their bistable state ("on" or "off") and thus only require initial calibration of spatial position on the sample target. Owing to the potentially large demagnification of the individual micromirrors of the DMA (i.e. 100s of nm in the diffraction limit of the field lens) the "true" image will be limited in pixelation resolution to ~100s of nm, which is still within an acceptable range for most imaging applications.

An embodiment of the present invention is derived by intentionally generating noncongruent patterns of light for purposes of simultaneously generating a plurality of ion sources. In this manner, the plurality of ion sources can be used for injecting a multiple ion packets into a plurality of mass analyzers such as a mass analyzer array (see for example Ref. 22). E. Badman and R. Graham Cooks, A Parallel Miniature Cylindrical Ion Trap Array, *Anal. Chem.* 72, 3291-3297 (2000). Thus, the effective plurality of ion sources allows for multiplexed simultaneous analysis of multiple ion packets, or for parallel mass analysis in a spatially-resolved mode owing to the correspondence of position from which the ions were generated and the mass analyzer utilized for detection.

It should be recognized by those skilled-in-the-art that the present invention can be used in conjunction with any system for which a tailored pattern of uniform light is desired. For example, the method and system for patterning light detailed herein can be used for the generation of desorbed neutral atoms or molecules, or for ionizing atoms or molecules in a spatially-resolved mode for use by a variety of gas, liquid, or solid methods (e.g. mass spectrometry, ion mobility, ion mobility-mass spectrometry, photo-affinity labeling, etc.).

All patents and publications referenced herein are hereby incorporated by reference. It will be understood that certain of the above-described structures, functions, and operations of the above-described embodiments are not necessary to practice the present invention and are included in the description simply for completeness of an exemplary embodiment or embodiments. In addition, it will be understood that specific structures, functions, and operations set forth in the above-described referenced patents and publications can be practiced in conjunction with the present invention, but they are not essential to its practice. It is therefore to be understood that the invention may be practiced otherwise than as specifically described without actually departing from the spirit and scope of the present invention as defined by the appended claims.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

REFERENCES CITED

U.S. PATENT AND PATENT APPLICATION DOCUMENTS

U.S. Pat. No. 4,566,935 L. J. Hornbeck, Spatial Light Modulator and Method (Jan. 28, 1986).

U.S. Pat. No. 5,808,300 R. M. Caprioli, Method and apparatus for imaging biological samples with MALDI MS (Sep. 15, 1998).

U.S. Pat. No. 6,046,808 W. G. Fateley, Radiation Filter, Spectrometer, and Imager Using a Micro-Mirror Array (Apr. 4, 2002).

U.S. Pat. No. 2003/0073145 A1 R. Caprioli, Methods and Apparatus for Analyzing Biological Samples by Mass Spectrometry (Apr. 17, 2003)

FOREIGN PATENT DOCUMENTS

PCT WO 02/27285 A1 W. G. Fateley, R. Coifinan, F. Geshwind, and R. A. Deverse, System and Method for Encoded Spatio-Spectral Information Processing (Apr. 4, 2002).

What is claimed is:

1. A method for inspecting a sample comprising the steps of:

providing a wavefront of photons from a photon source;

transforming the wavefront of photons into a uniform intensity profile;

selectively varying the spatial distribution of photons within said uniform intensity profile to construct a photon pattern using a digital micro-mirror array;

focusing said photon pattern on at least a portion of a sample; and, desorbing, and optionally ionizing, at least a portion of said sample.

2. The method of claim 1, further comprising mass spectrometric analysis of said sample after said step of desorbing.

3. The method of claim 1, further comprising ion mobility spectrometric analysis of said sample after said step of desorbing.

4. The method of claim 1, wherein said step of providing comprises generating photons from a radiation source selected from the group consisting of a laser, a Nernst glower, a globar, an arc discharge, a plasma discharge, a hollow cathode lamp, a synchrotron, a flashlamp, a resistively heated source, and any combination thereof.

5. The method of claim 1, wherein said step of transforming comprises using one or more refractive homogenizer optical elements.

6. The method of claim 5, wherein said one or more refractive homogenizer optical elements is selected from the group consisting of a prism homogenizer, a crossed-cylindrical lens array, an off-axis cylindrical lens, and any combination thereof.

7. The method of claim 1, wherein said step of transforming comprises using one or more non-refractive homogenizer optical elements.

8. The method of claim 7, wherein said one or more non-refractive homogenizer optical elements is selected from the group consisting of a reflective non-refractive optical element, a diffractive non-refractive optical element, and any combination thereof.

9. The method of claim 1, wherein said step of transforming comprises using a waveguide.

10. The method of claim 9, wherein said waveguide is a fiber optic.

11. The method of claim 1, wherein said sample is biological tissue.

12. The method of claim 11, wherein said biological tissue is plant or animal tissue.

13. The method of claim 1, wherein said sample is a laser microcapture dissection sample.

14. The method of claim 1, wherein said sample is selected from the group consisting of a protein, a nucleotide, a nucleic acid, a deoxynucleic acid, a protein microarray, a nucleotide microarray, a nucleic acid microarray, a deoxynucleic acid microarray, an immobilized biological material, a patterned biological material, and any combination thereof.

15. The method of claim 1, wherein said sample is selected from the group consisting of inorganic samples, semiconductors, ceramics, polymers, composites, metals, alloys, glasses, fibers, and any combination thereof.

16. The method of claim 1, further comprising the step of correcting said spatial distribution for perspective distortion.

17. The method of claim 16, wherein said step of correcting comprises using selected photon patterns for said step of focusing, said selected photon patterns designed to eliminate perspective distortion.

18. The method of claim 16, wherein said step of correcting comprises calibrating for perspective distortion using an image captured by a CCD array.

19. An apparatus for inspecting a sample, said apparatus comprising:

a source for providing a wavefront of photons, said source having sufficient power to desorb, and optionally ionize, at least a portion of said sample;

means for transforming the wavefront of photons into a uniform intensity profile, said means for transforming being fluidly coupled to said source;

a digital micro-mirror array for selectively varying the spatial distribution of photons within said uniform intensity profile to construct a photon pattern, said digital micro-mirror array being fluidly coupled to said means for transforming;

means for focusing said photon pattern onto said sample, said means for focusing being fluidly coupled to said means for selectively varying digital micro-mirror array.

20. The apparatus of claim 19, further comprising a mass spectrometer fluidly coupled to said sample such that at least a portion of material desorbed and optionally ionized from said sample enters said mass spectrometer.

21. The apparatus of claim 19, further comprising an ion mobility spectrometer fluidly coupled to said sample such that at least a portion of material desorbed and optionally ionized from said sample enters said ion mobility spectrometer.

22. The apparatus of claim 19, wherein said source is selected from the group consisting of a laser, a Nernst glower, a globar, an arc discharge, a plasma discharge, a hollow cathode lamp, a synchrotron, a flashlamp, a resistively heated source, and any combination thereof.

23. The apparatus of claim 19, wherein said means for transforming comprises one or more refractive homogenizer optical elements.

24. The apparatus of claim 23, wherein said one or more refractive homogenizer optical elements is selected from the group consisting of a prism homogenizer, a crossed-cylindrical lens array, an off-axis cylindrical lens, and any combination thereof.

25. The apparatus of claim 19, wherein said means for transforming comprises one or more non-refractive homogenizer optical elements.

26. The apparatus of claim 25, wherein said one or more non-refractive homogenizer optical elements is selected from the group consisting of a reflective homogenizer optical element, a diffractive homogenizer optical element, and any combination thereof.

27. A method for inspecting a sample comprising the steps of:

providing a plurality of wavefronts of photons from a plurality of photon sources;

transforming said plurality of wavefronts into a plurality of uniform intensity profiles;

selectively varying the spatial distribution of photons within said uniform intensity profiles to construct a plurality of photon patterns using a digital micro-mirror array;

focusing said plurality photon patterns onto a sample; and, desorbing, and optionally ionizing, at least a portion of said sample to form a plurality of packets of desorbed and optionally ionized material.

28. The method of claim 27, further comprising the step of mass spectrometric analysis of said sample after said step of desorbing, said step of mass spectrometric analysis being performed with one or more mass spectrometers.

29. The method of claim 27, further comprising the step of ion mobility spectrometric analysis of said sample after said step of desorbing, said step of ion mobility spectrometric analysis being performed with one or more ion mobility spectrometers.

30. The method of claim 27, wherein said step of providing comprises generating photons from a radiation source selected from the group consisting of a laser, a Nernst glower, a globar, an arc discharge, a plasma discharge, a hollow cathode lamp, a synchrotron, a flashlamp, a resistively heated source, and any combination thereof.

31. The method of claim 27, wherein said step of transforming comprises using one or more refractive homogenizer optical elements.

32. The method of claim 31, wherein said one or more refractive homogenizer optical elements is selected from the group consisting of a prism homogenizer, a crossed-cylindrical lens array, an off-axis cylindrical lens, and any combination thereof.

33. The method of claim 27, wherein said step of transforming comprises using one or more non-refractive homogenizer optical elements.

34. The method of claim 33, wherein said one or more non-refractive homogenizer optical elements is selected from the group consisting of a reflective non-refractive optical element, a diffractive non-refractive optical element, and any combination thereof.

35. The method of claim 27, wherein said step of transforming comprises transforming using a waveguide.

36. The method of claim 35 wherein said waveguide is a fiber optic.

37. The method of claim 27, wherein said sample is biological tissue.

38. The method of claim 37, wherein said biological tissue is plant or animal tissue.

39. The method of claim 27, wherein said sample is a laser microcapture dissection sample.

40. The method of claim 27, wherein said sample is selected from the group consisting of a protein, a nucleotide, a nucleic acid, a deoxynucleic acid, a protein microarray, a nucleotide microarray, a nucleic acid microarray, a deoxynucleic acid microarray, an immobilized biological material, a patterned biological material, and any combination thereof.

41. The method of claim 27, wherein said sample is selected from the group consisting of inorganic samples, semiconductors, ceramics, polymers, composites, metals, alloys, glasses, fibers, and any combination thereof.

42. The method of claim 27, further comprising the step of correcting said spatial distribution for perspective distortion.

43. The method of claim 42, wherein said step of correcting comprises using selected photon patterns for said step of focusing, said selected photon patterns designed to eliminate perspective distortion.

44. The method of claim 42, wherein said step of correcting comprises calibrating for perspective distortion using an image captured by a CCD array.

45. The method of claim 27, wherein said plurality of photon patterns are noncongruent photon patterns.

46. A method for inspecting a sample comprising the steps of:

providing a wavefront of photons from a photon source;

transforming the wavefront of photons into a uniform intensity profile;

selectively varying the spatial distribution of photons within said uniform intensity profile to construct a photon pattern using a digital micro-mirror array;

focusing said photon pattern on at least a portion of a sample;

desorbing, and optionally ionizing, at least a portion of said sample to form a desorbed sample; and, thereafter performing mass spectrometry, or ion mobility spectrometry, or a combination of ion mobility spectrometry and mass spectrometry on at least a portion of said desorbed and optionally ionized sample.

* * * * *